(12) United States Patent
Lin et al.

(10) Patent No.: US 12,293,781 B2
(45) Date of Patent: May 6, 2025

(54) THREE-STATE SPINTRONIC DEVICE, MEMORY CELL, MEMORY ARRAY AND READ-WRITE CIRCUIT

(71) Applicant: INSTITUTE OF MICROELECTRONICS, CHINESE ACADEMY OF SCIENCES, Beijing (CN)

(72) Inventors: Huai Lin, Beijing (CN); Guozhong Xing, Beijing (CN); Zuheng Wu, Beijing (CN); Long Liu, Beijing (CN); Di Wang, Beijing (CN); Cheng Lu, Beijing (CN); Peiwen Zhang, Beijing (CN); Changqing Xie, Beijing (CN); Ling Li, Beijing (CN); Ming Liu, Beijing (CN)

(73) Assignee: INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 171 days.

(21) Appl. No.: 18/261,716

(22) PCT Filed: Jan. 21, 2021

(86) PCT No.: PCT/CN2021/072992
§ 371 (c)(1),
(2) Date: Jul. 17, 2023

(87) PCT Pub. No.: WO2022/155828
PCT Pub. Date: Jul. 28, 2022

(65) Prior Publication Data
US 2024/0071451 A1    Feb. 29, 2024

(51) Int. Cl.
*G11C 11/16* (2006.01)

(52) U.S. Cl.
CPC ...... *G11C 11/1673* (2013.01); *G11C 11/1655* (2013.01); *G11C 11/1657* (2013.01)

(58) Field of Classification Search
CPC ............ G11C 11/1673; G11C 11/1655; G11C 11/1657
See application file for complete search history.

(56) References Cited

U.S. PATENT DOCUMENTS 7,218,465 B1 * 5/2007 Deeman ................. B82Y 10/00
                                                     428/836
2013/0155754 A1   6/2013 Apalkov et al.
(Continued)

FOREIGN PATENT DOCUMENTS

CN      1883007 A      12/2006
CN    101047023 A      10/2007
(Continued)

OTHER PUBLICATIONS

International Search Report and Written Opinion for Chinese PCT application No. PCT/CN2021/072992, Dated Oct. 28, 2021, 11 pages including English Translation.
(Continued)

*Primary Examiner* — Min Huang
(74) *Attorney, Agent, or Firm* — Christopher R. Christenson; Kelly, Holt & Christenson, P.L.L.C.

(57) ABSTRACT

The three-state spintronic device includes: a bottom electrode, a magnetic tunnel junction and a top electrode from bottom to top. The magnetic tunnel junction includes: a spin-orbit coupling layer, a ferromagnetic free layer, a barrier tunneling layer, a ferromagnetic reference layer, three local magnetic domain wall pinning centers and domain wall nucleation centers. An antisymmetric exchange interaction is modulated, and the magnetic domain wall pinning centers are embedded in an interface between a heavy metal and the ferromagnetic free layer. The magnetic
(Continued)

domain wall nucleation centers are at two ends of the ferromagnetic free layer. A current pulse flows through the spin-orbit coupling layer to generate a spin current and the spin current is injected into the ferromagnetic free layer. Under a control of all-electrical controlled, an effective field of a spin-orbit torque drives domain wall to move and displace.

10 Claims, 6 Drawing Sheets

(56) References Cited

U.S. PATENT DOCUMENTS

| | | | | |
|---|---|---|---|---|
| 2013/0314978 | A1* | 11/2013 | Currivan | G11C 11/1675 365/158 |
| 2015/0325278 | A1* | 11/2015 | Bauer | G11C 13/04 365/158 |
| 2017/0352702 | A1* | 12/2017 | Braganca | H10N 50/85 |
| 2019/0043598 | A1 | 2/2019 | Vaysset et al. | |

FOREIGN PATENT DOCUMENTS

| | | |
|---|---|---|
| CN | 109449265 A | 3/2019 |
| CN | 109643690 A | 4/2019 |
| CN | 111986717 A | 11/2020 |
| GN | 102044255 A | 2/2015 |
| WO | 2019005156 A1 | 1/2019 |

OTHER PUBLICATIONS

Yi Cao et al., "Prospect of Spin-Orbitronic Devices and Their Applications". iScience, vol. 23, No. 10. Dated Oct. 23, 2020, 22 pages.

First Office Action for Chinese Application No. 202110084765.8. dated Jun. 1, 2022, 10 pages including English Translation.

Hiroyuki Tanaka et al., "Constant Velocity of Domain Wall Propagation Independent of Applied Field Strength in Vicalloy Wire", IEEE Transactions On Magnetics, vol. 43, No. 6, Dated Jun. 2007. 3 pages.

Tetsuhiro Suzuki et al, "Current-Driven Domain Wall Motion, Nucleation, and Propagation in a Co/Pt Multi-Layer Strip with a Stepped Structure", IEEE Transactions On Magnetics, vol. 44, No. 11, Dated Nov. 2008, 4 pages.

* cited by examiner

X  -1,-1,-1,0,0,0,+1,+1,+1

W  -1,0,+1,-1,0,+1,-1,0,+1

| + | + | + | + | + | + | + | + | + |
|---|---|---|---|---|---|---|---|---|
| 0 | 0 | 0 | 0 | 0 | 0 | 0 | 0 | 0 |
| + | + | + | + | + | + | + | + | + |
| 0 | 0 | 0 | 0 | 0 | 0 | 0 | 0 | 0 |

FIG. 7b

X GXNOR W

FIG. 7c

| + | - | - | - | + | + | - | + | + |
|---|---|---|---|---|---|---|---|---|
| 1 | 0 | 1 | 0 | 0 | 0 | 1 | 0 | 1 |
|   |   |   |   |   |   |   |   |   |
|   |   |   |   |   |   |   |   |   |
|   |   |   |   |   |   |   |   |   |
|   |   |   |   |   |   |   |   |   |
|   |   |   |   |   |   |   |   |   |
|   |   |   |   |   |   |   |   |   |
|   |   |   |   |   |   |   |   |   |

FIG. 7d

| X | | W | | X GXNOR W | |
|---|---|---|---|---|---|
| Sign bit | Numerical bit | Sign bit | Numerical bit | Sign bit | Numerical bit |
| - | 1 | - | 1 | + | 1 |
| - | 1 |   | 0 |   | 0 |
| - | 1 | + | 1 | - | 1 |
|   | 0 | - | 1 |   | 0 |
|   | 0 |   | 0 |   | 0 |
|   | 0 | + | 1 |   | 0 |
| + | 1 | - | 1 | - | 1 |
| + | 1 |   | 0 |   | 0 |
| + | 1 | + | 1 | + | 1 |

FIG. 7e

THREE-STATE SPINTRONIC DEVICE, MEMORY CELL, MEMORY ARRAY AND READ-WRITE CIRCUIT

CROSS-REFERENCE TO RELATED APPLICATION

This application is a Section 371 National Stage Application of International Application No. PCT/CN2021/072992, filed on Jan. 21, 2021, entitled "THREE-STATE SPINTRONIC DEVICE, MEMORY CELL, MEMORY ARRAY AND READ-WRITE CIRCUIT", the content of which is hereby incorporated by reference in its entirety.

TECHNICAL FIELD

The present disclosure relates to a field of an integrated circuit technology, and in particular, to a three-state spintronic device, a memory cell, a memory array, and a read-write circuit.

BACKGROUND

A neural network architecture has aroused a research upsurge in academia and industries due to unique advantages thereof in an image recognition, a semantic recognition, a classification task, etc. However, a process of training and recognizing a traditional convolutional neural network requires a large number of floating-point and double-precision convolutional operations. On the one hand, a large amount of data has an increasingly high requirement for a memory capacity of hardware, and on the other hand, a multiplication and addition operation used in the convolutional operation has a high requirement for an energy consumption and a duration, so that a neural network training may last for several days or even weeks.

In order to optimize a problem of the traditional convolutional neural network, simplify operation steps and ensure an accuracy of training and recognition, researchers propose a way of binary neural network (BNN) and ternary neural network (TNN), that is, data is converted into $\{-1,1\}$ or $\{-1,0,1\}$ for training and reasoning. While optimizing a memory space, an original floating-point multiplication and addition operation is converted into a simple Boolean logical and shift operation using an XNOR or GXNOR operation, which may improve an efficiency of the training and reasoning. Compared to the BNN, the TNN has a higher information capacity and does not increase a complexity of operations, which may have a great application potential. Hardware based on a ternary neural network operation is rarely reported.

SUMMARY

The present disclosure provides a three-state spintronic device, a memory cell, a memory array and a read-write circuit to solve the above-mentioned technical problems.

According to an aspect of the present disclosure, a three-state spintronic device is provided, including: a bottom electrode, a magnetic tunnel junction and a top electrode from bottom to top;
wherein the magnetic tunnel junction includes: a spin-orbit coupling layer, a ferromagnetic free layer, a barrier tunneling layer and a ferromagnetic reference layer from bottom to top; and the magnetic tunnel junction further includes:
three local magnetic domain wall pinning centers embedded in the spin-orbit coupling layer, wherein the three local magnetic domain wall pinning centers are respectively in contact with the ferromagnetic free layer, and a first pinning region, a second pinning region and a third pinning region are formed in the ferromagnetic free layer; and
magnetic domain wall nucleation centers at two ends of the ferromagnetic free layer, wherein the magnetic domain wall nucleation centers have an anisotropy constant of $7\times10^5$ J/m$^3$ to $9\times10^5$ J/m$^3$; a first nucleation region and a second nucleation region are formed in the ferromagnetic free layer; and
wherein a current pulse is injected into the spin-orbit coupling layer, and a spin current is generated to drive a magnetic domain wall in the ferromagnetic free layer to move, so that a resistance state switching is performed.

In some embodiments of the present disclosure, materials of the ferromagnetic free layer and the ferromagnetic reference layer are any one of CoFeB, CoFeAl and Co; a material of the spin-orbit coupling layer is W and/or Ta; and materials of the local magnetic domain wall pinning centers and the magnetic domain wall nucleation centers are Pt and/or Ir.

In some embodiments of the present disclosure, a moving direction of the magnetic domain wall is consistent with a direction of the injection of the current pulse.

In some embodiments of the present disclosure, the bottom electrode includes:
a first electrode connected to a first end of the spin-orbit coupling layer; and
a second electrode connected to a second end of the spin-orbit coupling layer;
wherein the first end of the spin-orbit coupling layer is arranged opposite to the second end of the spin-orbit coupling layer.

According to an aspect of the present disclosure, a memory cell is further provided, including:
the three-state spintronic device according to any one of claims 1 to 4;
a first transistor, wherein a first end of the first transistor is connected to a first end of the bottom electrode, a second end of the first transistor is configured to be connected to a write bit line, and a control end of the first transistor is configured to be connected to a write word line; a second end of the bottom electrode is configured to be connected to a source line; and
a second transistor, wherein a first end of the second transistor is connected to the top electrode, a second end of the second transistor is configured to be connected to a read bit line, and a control end of the second transistor is configured to be connected to a read word line.

According to an aspect of the present disclosure, a read-write circuit is further provided, including:
the memory cell as described above;
a first reference cell configured to obtain a first reference voltage according to an enable signal;
a first sense amplifier, wherein a first input end of the first sense amplifier is connected to a read bit line connected to the memory cell, a second input end of the first sense amplifier is configured to receive the first reference voltage, and output ends of the first sense amplifier output a first output signal and a first complementary signal, respectively;

a second reference cell configured to obtain a second reference voltage according to the first complementary signal;

a third reference cell configured to obtain a third reference voltage according to the first output signal; and a second sense amplifier, wherein a first input end of the second sense amplifier is connected to the read bit line connected to the memory cell, a second input end of the second sense amplifier is configured to receive the second reference voltage and the third reference voltage, and output ends of the second sense amplifier output a second output signal and a second complementary signal, respectively.

In some embodiments of the present disclosure, the first reference cell includes:

a third transistor, wherein a first end of the third transistor is grounded, and a control end of the third transistor receives the enable signal; and a first reference resistance, wherein an end of the first reference resistance is connected to a second end of the third transistor, and another end of the first reference resistance is connected to the second input end of the first sense amplifier;

wherein the second reference cell includes:

a fourth transistor, wherein a first end of the fourth transistor is grounded, and a control end of the fourth transistor receives the first complementary signal; and a second reference resistance, wherein an end of the second reference resistance is connected to a second end of the fourth transistor, and another end of the second reference resistance is connected to the second input end of the second sense amplifier; and wherein the third reference cell includes:

a fifth transistor, wherein a first end of the fifth transistor is grounded, and a control end of the fifth transistor receives the first output signal; and a third reference resistance, wherein an end of the third reference resistance is connected to a second end of the fifth transistor, and another end of the third reference resistance is connected to the second input end of the second sense amplifier.

According to an aspect of the present disclosure, a memory array is further provided, including: m read word lines, m write word lines, n write bit lines, n read bit lines, n source lines, and m rows and n columns of memory cells, wherein the memory cell is the memory cell as described above, and each of m and n is a positive integer;

each of the memory cells in a same column is connected to a same write bit line, each of the memory cells in the same column is connected to a same read bit line, and each of the memory cells in the same column is connected to a same source line; and each of the memory cells in a same row is connected to a same write word line, and each of the memory cells in the same row is connected to a same read word line.

According to an aspect of the present disclosure, a read-write circuit is further provided, including:

the memory array as described above;

a bit line decoder configured to provide a bit line operating voltage to n write bit lines and n read bit lines;

a word line decoder configured to provide a word line operating voltage to m read word lines and m write word lines;

a source line decoder configured to provide a source line operating voltage and an induced current to n source lines; and a read operation module configured to read data stored in the memory array and perform a logical operation on the data stored in the memory array.

In some embodiments of the present disclosure, the read operation module includes:

a first reference cell configured to provide a first reference voltage when performing a read operation on the memory array or performing a logical operation or an operation on the memory array, wherein the first reference cell includes:

a third transistor, wherein a first end of the third transistor is grounded, and a control end of the third transistor receives the enable signal; and a first reference resistance, wherein an end of the first reference resistance is connected to a second end of the third transistor, and another end of the first reference resistance is connected to a second input end of a first sense amplifier;

the first sense amplifier, wherein a first input end of the first sense amplifier is connected to n read bit lines connected to the memory cell, the second input end of the first sense amplifier is configured to receive the first reference voltage, and output ends of the first sense amplifier output a first output signal and a first complementary signal, respectively;

a second reference cell configured to obtain a second reference voltage according to the first complementary signal when performing a logical operation or an operation on the memory array, wherein the second reference cell includes:

a fourth transistor, wherein a first end of the fourth transistor is grounded, and a control end of the fourth transistor receives the first complementary signal; and a second reference resistance, wherein an end of the second reference resistance is connected to a second end of the fourth transistor, and another end of the second reference resistance is connected to a second input end of a second sense amplifier;

a third reference cell configured to obtain a third reference voltage according to the first output signal when performing a logical operation or an operation on the memory array, wherein the third reference cell includes:

a fifth transistor, wherein a first end of the fifth transistor is grounded, and a control end of the fifth transistor receives the first output signal; and a third reference resistance, wherein an end of the third reference resistance is connected to a second end of the fifth transistor, and another end of the third reference resistance is connected to the second input end of the second sense amplifier; and the second sense amplifier, wherein a first input end of the second sense amplifier is connected to the read bit line connected to the memory cell, the second input end of the second sense amplifier is configured to receive the second reference voltage and the third reference voltage, and output ends of the second sense amplifier output a second output signal and a second complementary signal, respectively.

BRIEF DESCRIPTION OF THE DRAWINGS

FIG. 6 shows a schematic structural diagram of a read-write circuit based on a memory array according to embodiments of the present disclosure;

FIG. 7a to FIG. 7e show schematic diagrams of GXNOR operation process of a valuing vector in a memory array.

DETAILED DESCRIPTION OF EMBODIMENTS

The present disclosure provides a three-state spintronic device, a memory cell, a memory array and a read-write circuit. The three-state spintronic device includes: a bottom electrode, a magnetic tunnel junction and a top electrode from bottom to top; the magnetic tunnel junction includes: a spin-orbit coupling layer, a ferromagnetic free layer, a barrier tunneling layer, a ferromagnetic reference layer, three local magnetic domain wall pinning centers and domain wall nucleation centers; the local magnetic domain wall pinning centers are embedded in the spin-orbit coupling layer and in contact with the ferromagnetic free layer; the magnetic domain wall nucleation centers are at two ends of the ferromagnetic free layer; a current pulse is injected into the spin-orbit coupling layer, and a spin current is generated to drive a magnetic domain wall in the ferromagnetic free layer to move, so that a resistance state switching is performed. In the present disclosure, a spin-orbit torque may effectively drive a domain wall to move and displace under a full electric field condition without an external field assistance. A magnitude and a direction of the displacement may be modulated by the number of pulses, a pulse width and a direction of a current, which may have a high reliability and a circuit compatibility.

In order to make objectives, technical solutions and advantages of the present disclosure clearer, the present disclosure will be further described in detail below with reference to specific embodiments and accompanying drawings.

Some embodiments of the present disclosure will be described more comprehensively below with reference to the accompanying drawings, some but not all of which will be shown. In fact, various embodiments of the present disclosure may be implemented in many different forms, and should not be construed as being limited to embodiments described in the present disclosure; correspondingly, the embodiments are provided such that the present disclosure may meet an applicable legal requirement.

Figure 1:
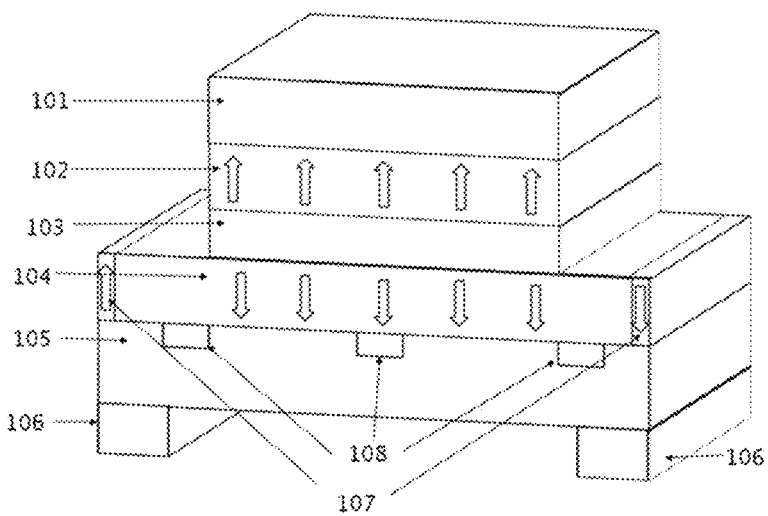
FIG. 1 shows a schematic diagram of a three-state spintronic device according to embodiments of the present disclosure.

In an exemplary embodiment of the present disclosure, a three-state spintronic device is provided. FIG. 1 shows a schematic diagram of a three-state spintronic device according to embodiments of the present disclosure. As shown in FIG. 1, the three-state spintronic device of the present disclosure includes: a bottom electrode 106, a magnetic tunnel junction, and a top electrode 101 from bottom to top. A basic structure of the three-state spintronic device is the magnetic tunnel junction, and the magnetic tunnel junction is connected to an external circuit through the top electrode 101 and two bottom electrodes 106.

The magnetic tunnel junction includes: a ferromagnetic reference layer 102, a barrier tunneling layer 103, a ferromagnetic free layer 104, a spin-orbit coupling layer 105, a magnetic domain wall nucleation centers 107, and a local magnetic domain wall pinning centers 108. Specifically, the magnetic tunnel junction includes: the spin-orbit coupling layer 105, the ferromagnetic free layer 104, the barrier tunneling layer 103, and the ferromagnetic reference layer 102 from bottom to top. The magnetic domain wall nucleation centers 107 are arranged at two ends of the ferromagnetic free layer 104, and have a lower anisotropy constant, which may be specifically $7\times10^5$ J/m$^3$ to $9\times10^5$ J/m$^3$. Three local magnetic domain wall pinning centers 108 are embedded in the spin-orbit coupling layer 105 and in contact with the ferromagnetic free layer 104.

An interface between the local magnetic domain wall pinning center 108 and the ferromagnetic free layer 104 enhances a DM constant, and forms pinning of a magnetic domain wall in the ferromagnetic free layer 104. Accordingly, the spintronic device with three resistance states may be implemented.

A selection of materials of each component in the magnetic tunnel junction will be described in detail.

Materials of the ferromagnetic reference layer 102 and the ferromagnetic free layer 104 are composed of one or more of CoFeB, CoFeAl, CoFe, and Co, for example, any one of CoFeB, CoFeAl, CoFe, Co, any two of CoFeB, CoFeAl, CoFe, Co, or any three of CoFeB, CoFeAl, CoFe, and Co.

A material of the spin-orbit coupling layer 105 is W, Ta, a W alloy or a Ta alloy.

Materials of the local magnetic domain wall pinning centers 108 and the magnetic domain wall nucleation centers 107 are selected from one of Pt and Ir.

Figure 2A:
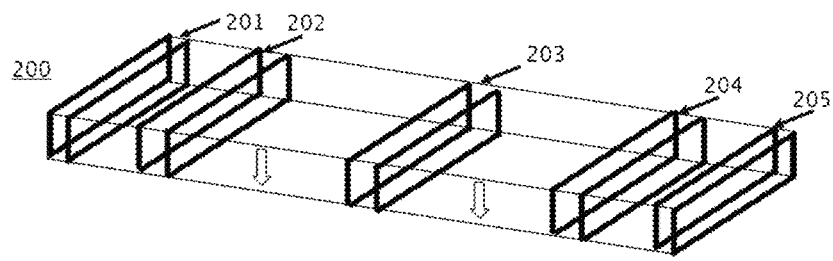
FIGS. 2a to 2c show magnetization distributions of a ferromagnetic free layer in a three-state spintronic device in different resistance states according to embodiments of the present disclosure.
Figure 2B:
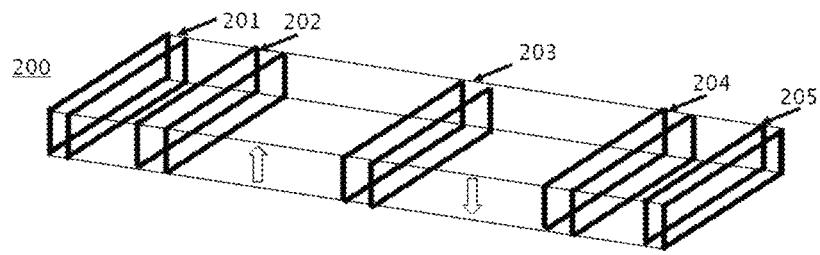
Figure 2C:
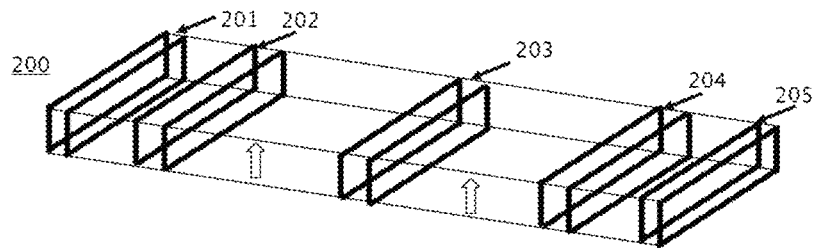

FIG. 2a to FIG. 2c show magnetization distributions of a ferromagnetic free layer in a three-state spintronic device in different resistance states according to embodiments of the present disclosure. As shown in FIG. 2a to FIG. 2c, the ferromagnetic free layer includes: a first nucleation region 201 corresponding to the magnetic domain wall nucleation center, a second nucleation region 205 corresponding to the magnetic domain wall nucleation center, and a first pinning region 202, a second pinning region 203 and a third pinning region 204 corresponding to three local magnetic domain wall pinning centers, respectively.

A current pulse is injected into the spin-orbit coupling layer, and a spin current is generated to drive a magnetic domain wall in the ferromagnetic free layer to move from an initial state to a next pinning or nucleation region (device boundary), so that a switching between different resistance states may be achieved in the magnetic tunnel junction. The resistance state switching in the magnetic tunnel junction is related to a direction of the injection of the current. Specifically, a moving direction of the magnetic domain wall is the same as a direction of the injection of the current pulse.

Taking an initial magnetization direction downwards as an example, FIG. 2a shows a first resistance state corresponding to an initial state of a magnetic domain. After a nucleation current, the magnetic domain wall is formed in the first nucleation region 201, and then the magnetic domain wall moves to the first pinning region 202 that is located on the left side of the three-state spintronic device and corresponds to the local magnetic domain wall pinning center.

FIG. 2b shows a second resistance state corresponding to the initial state of the magnetic domain. During the resistance state switching, a bottom electrode on the left inputs the current pulse to drive the magnetic domain wall to move from the first pinning region to a middle local magnetic domain wall pinning center of the three-state spintronic device which corresponds to the second pinning region 203.

FIG. 2c shows a third resistance state corresponding to the initial state of the magnetic domain. A pulse is input again to drive the magnetic domain wall to enter a right-side local magnetic domain wall pinning center of the three-state spintronic device which corresponds to the third pinning region 204. At this time, a magnetization direction of the ferromagnetic free layer is upward, which is opposite to an initial magnetization direction.

In other embodiments, when the current pulse is applied in reverse, a moving direction of the magnetic domain wall is opposite to the moving direction of the magnetic domain wall in the above-mentioned embodiments.

In other embodiments, a reverse reset current with a wider pulse width may switch the resistance state from the third resistance state to the first resistance state.

For example, the ferromagnetic free layer has a size of 240 nm×70 nm×0.8 nm, and uses a CoFeB material as a simulation material.

Figure 3A:
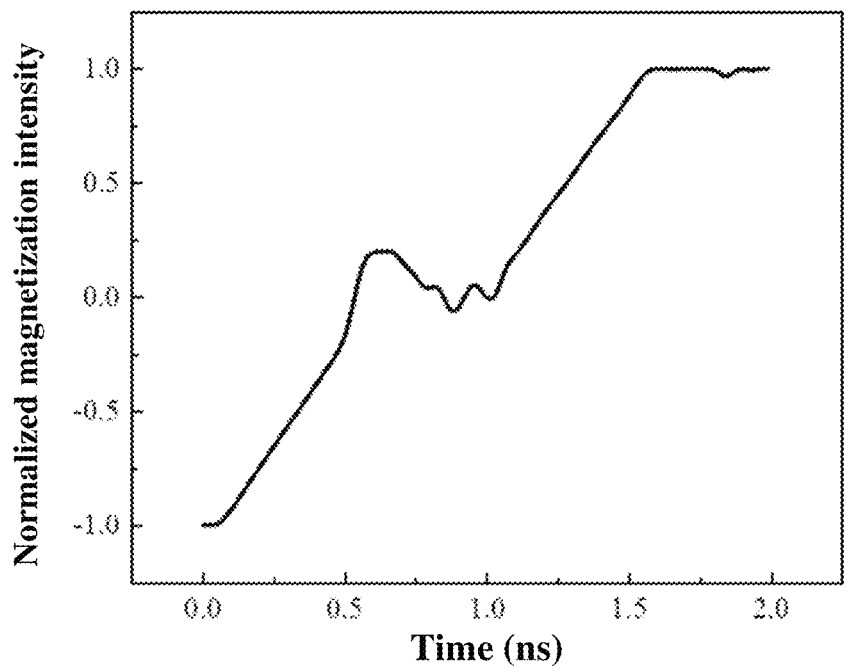
FIG. 3a and FIG. 3b show experimental data of a resistance state switching of a three-state spintronic device controlled by a pulse without an external magnetic field according to embodiments of the present disclosure.

FIG. 3a shows experimental data of a resistance state switching of a three-state spintronic device controlled by a pulse without an external magnetic field according to embodiments of the present disclosure, which demonstrates a switching of resistance states of the three-state spintronic device by the current pulse. A magnetization of the ferromagnetic free layer changes after sequentially injecting current pulses, so that different resistance states may be generated. Driven by a single current pulse with a pulse width of $4.78 \times 10^7$ A/cm$^2$, 0.167 ns, a normalized magnetization intensity $M_z/M_s$ in the ferromagnetic free layer is driven from approach to −1 at an initial timing (in which a magnetization direction is antiparallel to the ferromagnetic reference layer) to an approach plane, that is, a position of $M_z/M_s=0$. At this time, the domain wall moves from the first pinning region 202 to the second pinning region 203, and oscillates near the region, so as to switch the first resistance state of the device to the second resistance state of the device.

If a next pulse is applied with a longer interval (which is generally 1 ns to 10 ns), the device may be stable in a current resistance state (the first resistance state, the second resistance state, or the third resistance state).

At 1 ns, a second pulse is applied, and $M_z/M_s$ approaches 1 (in which the magnetization direction is antiparallel to the ferromagnetic reference layer). The magnetic domain wall enters the third pinning region 204. At this time, the device is in the third resistance state. Thus, the pulse may control the resistance state switching sequentially.

Figure 3B:
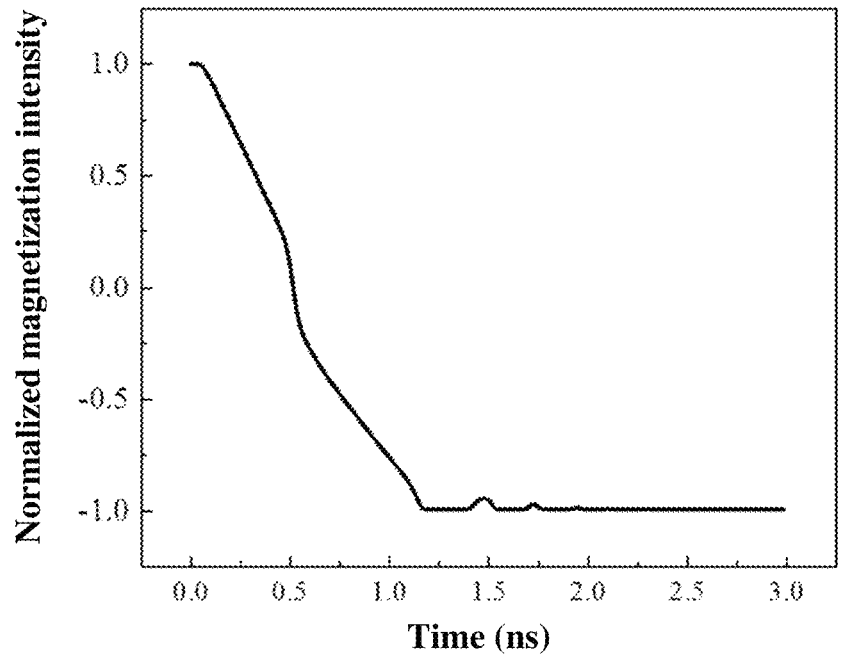

In a process of applying the three-state spintronic device, in addition to an unidirectional switching between adjacent resistance states shown in FIG. 2a to FIG. 2c, a reverse reset operation is also required. The specific operation may be to switch the resistance state of the three-state spintronic device from the third resistance state to the first resistance state by sequentially applying a current pulse opposite to those shown in FIG. 2a to FIG. 2c, or to applying a current pulse with a wider pulse width. As shown in FIG. 3b, when the three-state spintronic device is in the third resistance state, a single current pulse with an amplitude of $4.78 \times 10^7$ A/cm$^2$ and a pulse width of 0.5 ns is applied in a current direction opposite to an original current direction. After a relaxation time, a magnetization state is returned to the initial state at 1.5 ns, and the resistance state is then reset to the first resistance state. A nanosecond switching speed also shows a potential of the three-state spintronic device for a high-speed operation.

In an exemplary embodiment of the present disclosure, a memory cell is further provided, including: the three-state spintronic device as described above, a first transistor, and a second transistor. The memory cell will be further described in detail below.

A first end (drain end) of the first transistor is connected to a first electrode of the three-state spintronic device, a second end (source end) of the first transistor is used to be connected to a write bit line, and a control end (gate end) of the first transistor is used to be connected to a write word line. A second electrode of the three-state spintronic device is used to be connected to a source line.

A first end (drain end) of the second transistor is connected to a top electrode, a second end (source end) of the second transistor is used to be connected to a read bit line, and a control end (gate end) of the second transistor is used to be connected to a read word line.

In an exemplary embodiment of the present disclosure, a read-write circuit is further provided, including: the memory cell as described above, a first reference cell, a first sense amplifier, a second reference cell, a third reference cell, and a second sense amplifier. The memory cell based on the read-write circuit will be further described in detail below.

The first reference cell is used to obtain a first reference voltage according to an enable signal. A first input end of the first sense amplifier is connected to a read bit line connected to the memory cell, a second input end of the first sense amplifier is used to receive the first reference voltage, and output ends of the first sense amplifier output a first output signal and a first complementary signal, respectively. The second reference cell is used to obtain a second reference voltage according to the first complementary signal. The third reference cell is used to obtain a third reference voltage according to the first output signal. A first input end of the second sense amplifier is connected to the read bit line connected to the memory cell, a second input end of the second sense amplifier is used to receive the second reference voltage and the third reference voltage, and output ends of the second sense amplifier output a second output signal and a second complementary signal, respectively.

Compositions of the first reference cell, the second reference cell, and the third reference cell will be introduced below, respectively.

The first reference cell includes: a third transistor and a first reference resistor. A control end (gate end) of the third transistor receives an enable signal, a first end (source end) of the third transistor is grounded, a second end (drain end) of the third transistor is connected to an end of the first reference resistor, and another end of the first reference resistor is connected to the second input end of the first sense amplifier.

The second reference cell includes: a fourth transistor and a second reference resistor. A control end (gate end) of the fourth transistor receives the first complementary signal, a first end (source end) of the fourth transistor is grounded, a second end (drain end) of the fourth transistor is connected to an end of the second reference resistor, and another end of the second reference resistor is connected to the second input end of the second sense amplifier.

Figure 4:
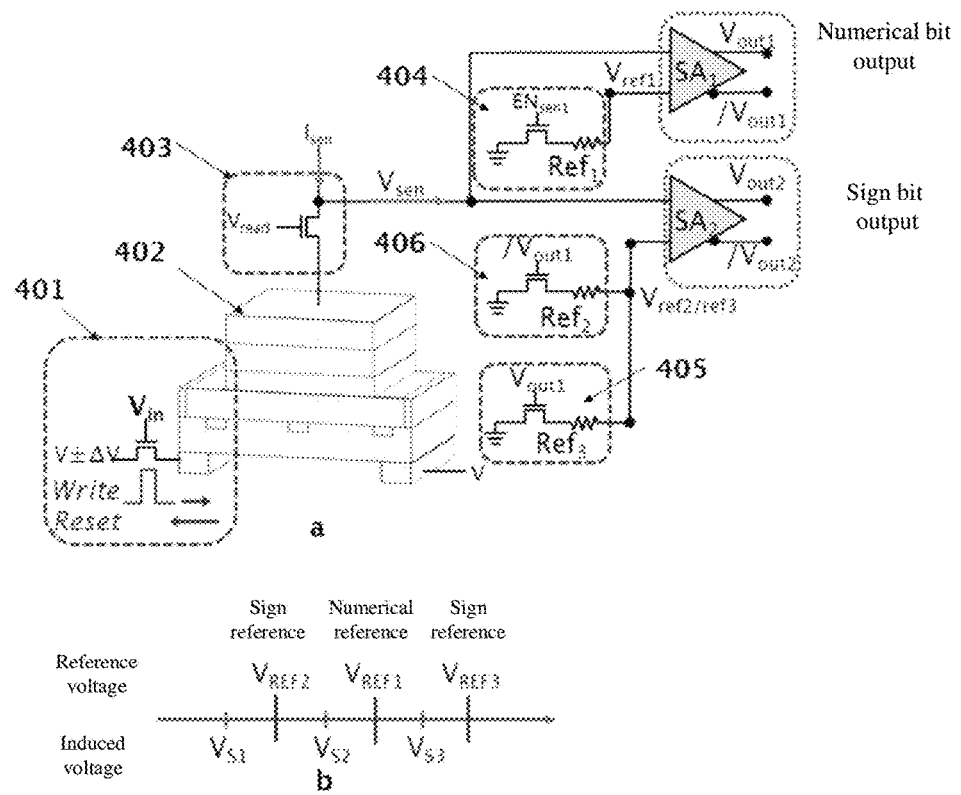
FIG. 4 shows a schematic structural diagram of a read-write circuit based on a memory cell according to embodiments of the present disclosure.

The third reference cell includes: a fifth transistor and a third reference resistor. A control end (gate end) of the fifth transistor receives the first output signal, a first end (source end) of the fifth transistor is grounded, a second end (drain end) of the fifth transistor is connected to an end of the third reference resistor, and another end of the third reference resistor is connected to the second input end of the second sense amplifier. Taking the three-state spintronic device serving as a neural network synapse as an example, FIG. 4 shows a schematic diagram of a read-write circuit structure based on a memory cell according to embodiments of the present disclosure. As shown in a and b in FIG. 4, the read-write circuit provided by the present disclosure includes: a first transistor 401, a three-state spintronic device 402, a second transistor 403, a first reference cell 404, a first sense amplifier SA1, a second reference cell 405, a third reference cell 406, and a second sense amplifier SA2.

In the initial state, a memory state of the three-state spintronic device is the first resistance state, which has corresponding data of "00". A write signal $V_{in}$, which is used as a gate control signal of the first transistor 401 connected to the first electrode, controls a conduction and a shutdown of the first transistor 401.

When writing data, the write signal $V_{in}$ is placed at a high level to control the conduction of the first transistor 401. A single pulse current is injected into the spin-orbit coupling layer to drive the magnetic domain wall in the ferromagnetic free layer to move to the first pinning region. The data is written as "01", and then the memory state of the three-state spintronic device is the second resistance state. According to the above, when the memory state of the three-state spintronic device is the third resistance state, the data is written as "10".

During a reset operation, a reset pulse with a same amplitude and a pulse width of 0.5 ns is applied in an opposite direction, which may reset the resistance state of the three-state spintronic device from the third resistance state to the first resistance state. The above dimensions and current parameters vary depending on a structure and a material of the device, which will not be limited in the present disclosure.

During a reading process, the write signal $V_{in}$ is placed at a low level, and a high level is applied to a read signal $V_{read}$ received by a control end (gate end) of the second transistor 403. Accordingly, the second transistor 403 is turned on, and an induced current pulse passes through the magnetic tunnel junction to generate a source reference voltage $V_{sen}$, which is input to a first input end of the first sense amplifier SA1 and a first input end of the second sense amplifier SA2, respectively. In an application of a ternary neural network, the first sense amplifier SA1 is output as a numerical bit of a ternary operation, and the second sense amplifier SA2 is output as a sign bit. An enable signal (a first output signal $V_{out1}$ and a first complementary signal/$V_{out1}$) of the second sense amplifier SA2 is slightly delayed than an enable signal $EN_{sen1}$ of the first sense amplifier SA1. At this time, the enable signal $EN_{sen1}$ enters the first reference cell 404, and a reference current flows through a first reference resistor $R_{ef1}$ to generate a first reference voltage $V_{ref1}$, which is used to determine whether the memory cell is in the first resistance state, the second resistance state, or the third resistance state. The source reference voltage $V_{sen}$ and the first reference voltage $V_{ref1}$ are jointly input into the first sense amplifier SA1. If a read memory cell is in the first resistance state or the second resistance state, the first output signal $V_{out1}$ of the first sense amplifier SA1 is output as "0"; if the read memory cell is in the third resistance state, the first output signal $V_{out1}$ of the first sense amplifier SA1 is output as "1". The first output signal $V_{out1}$ and the first complementary signal/$V_{out1}$, which are simultaneously used as a gate control signal for the second reference cell 405 and the third reference cell 406, may be used to control the fourth transistor and the fifth transistor to generate the second reference voltage and the third reference voltage, respectively.

Specifically, when the memory cell is in the first resistance state or the second resistance state, the first output signal $V_{out1}$ is output as "0". At this time, the first complementary signal/$V_{out1}$=1 controls a second reference resistor $Ref_2$ in the second reference cell 405 to generate a second reference voltage $V_{ref2}$ so as to distinguish the first resistance state and the second resistance state. When the memory cell is in the first resistance state, a second output signal $V_{out2}$=0, an output of the first output signal $V_{out1}$ is synthesized, and the read memory data is "00". When the memory cell is in the second resistance state, the second output signal $V_{out2}$=1, and when the output of the first output signal $V_{out1}$ is synthesized, the read memory data is "01". When the memory cell is in the third resistance state, the first output signal $V_{out1}$ is output as "1", a third reference resistor $Ref_3$ in the third reference cell 406 is controlled to generate the third reference voltage, and the second output signal $V_{out2}$=0 of the second sense amplifier SA2. When the output of the first output signal $V_{out1}$ is synthesized, the read memory data is "10". It can thus be seen that the first sense amplifier SA1 outputs high bits of the corresponding resistance state, which are "S1=0, S2=0, S3=1"; the second sense amplifier SA2 outputs low bits of the corresponding resistance state, which are "S1=0, S2=1, S3=0". Therefore, we may define in a subsequent operation that: the first output signal $V_{out1}$ output by the first sense amplifier SA1 is used as a numerical bit, a low-level output is used as "0", and a high-level output is used as "1"; the second output signal $V_{out2}$ of the second sense amplifier SA2 is used as a sign bit, the low-level output is used as "+", and the high-level output is used as "−".

Figure 5:
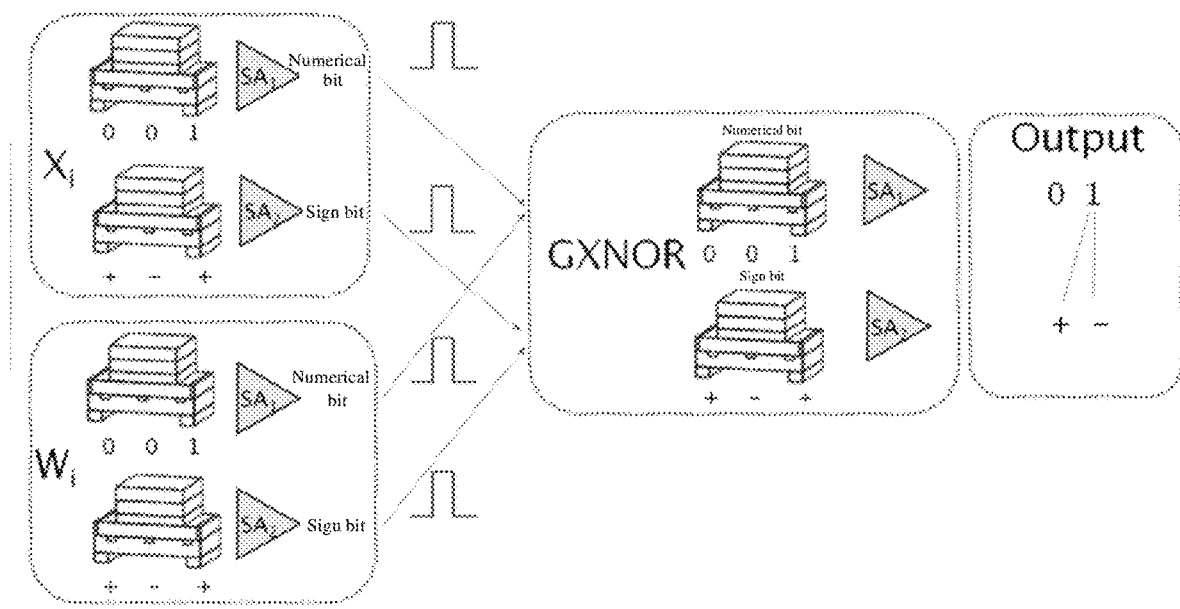
FIG. 5 shows a schematic diagram of achieving a GXNOR operation using a three-state spintronic device.

FIG. 5 shows a schematic diagram of a GXNOR operation using a three-state spintronic device. As shown in FIG. 5, in an implementation operation of a ternary synaptic output operation using the three-state spintronic device, an input value Xi and a synaptic weight Wi are written into two memory cells, one of which is a numerical bit, and the other of which is a sign bit. Values stored by the memory cells are read by the first sense amplifier SA1 and the second sense amplifier SA2 in the corresponding read circuit. No matter which memory cell it is, when an output of the memory cell is at a high level, a corresponding memory cell when a pulse is injected into a GXNOR calculation is generated. For example, when Xi=+1 and Wi=−1, the numerical bit of Xi is in the third resistance state, and the sign bit of Xi is in the first resistance state; the numerical bit of Wi is in the third resistance state, and the sign bit of Wi is in the second resistance state. During operations of the two, read enables are enabled respectively, and the numerical bit of Xi is read as "1". A pulse is injected into the numerical bit of a GXNOR operation cell, and a resistance state of the GXNOR operation cell is switched from the first resistance state to the second resistance state. Then, the numerical bit of Wi is also read as "1". A next pulse is injected into the numerical bit of the GXNOR operation cell, and the resistance state of the GXNOR operation cell is switched from the second resistance state to the third resistance state. In the sign bit, the sign bit of Xi is read as "0". No pulse is injected into the GXNOR operation cell, and the GXNOR operation cell has an unchanged resistance state, that is, an initial resistance state; then, the sign bit of Wi is read as "1". A pulse is injected into the sign bit of the GXNOR operation cell, and the resistance state of the GXNOR operation cell is switched from the initial resistance state to the second resistance state. Operation results of Xi and Wi may be obtained using the same reading method. The numerical bit is output as "1", and the sign bit is output as "1", that is, "−". Therefore, the result is "−1". The above-mentioned operations of the numerical bit and the sign bit may be performed in parallel.

In an exemplary embodiment of the present disclosure, a memory array is further provided, including: m read word lines, m write word lines, n write bit lines, n read bit lines, n source lines, and m rows and n columns of memory cells, wherein the memory cell is the above-mentioned memory cell, and m and n are positive integers. Each of the memory cells in a same column is connected to a same write bit line, each of the memory cells in the same column is connected to a same read bit line, and each of the memory cells in the same column is connected to a same source line. Each of the memory cells in a same row is connected to a same write word line, and each of the memory cells in the same row is connected to a same read word line.

Figures 6, 7A:
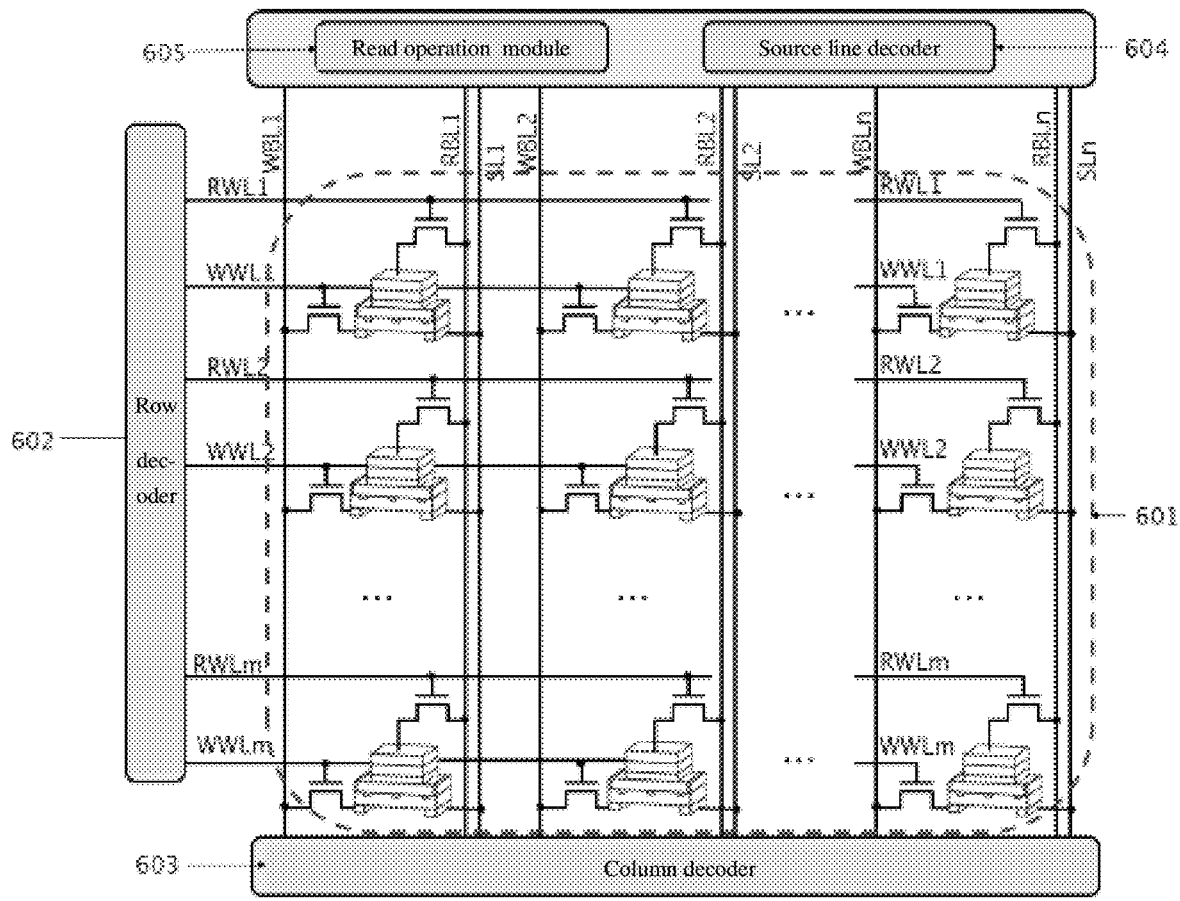

In an exemplary embodiment of the present disclosure, a read-write circuit is further provided. FIG. 6 shows a schematic structural diagram of a read-write circuit based on a memory array according to embodiments of the present disclosure. As shown in FIG. 6, the read-write circuit provided by the embodiments includes: a memory array 601, a row decoder 602, a column decoder 603, a source line decoder 604, and a read operation module 605. The read-write circuit will be further described in detail below.

The column decoder 603 is used to provide a bit line operating voltage to n write bit lines and n read bit lines.

The line decoder 602 is used to provide a word line operating voltage to m read word lines and m write word lines.

The source line decoder 604 is used to provide a source line operating voltage and an induced current to n source lines.

The read operation module 605 is used to read data stored in the memory array 601 and perform a logical operation on the data stored in the memory array 601. The read operation module 605 includes: a first reference cell, a first sense amplifier, a second reference cell, a third reference cell, and a second sense amplifier. The first reference cell includes: a third transistor and a first reference resistor. The second reference cell includes: a fourth transistor and a second reference resistor. The third reference cell includes: a fifth transistor and a third reference resistor.

The specific content of the above-mentioned device is similar to that of the memory cell based on the read-write circuit as described above, and will not be repeated here.

Figures 7B, 7C:
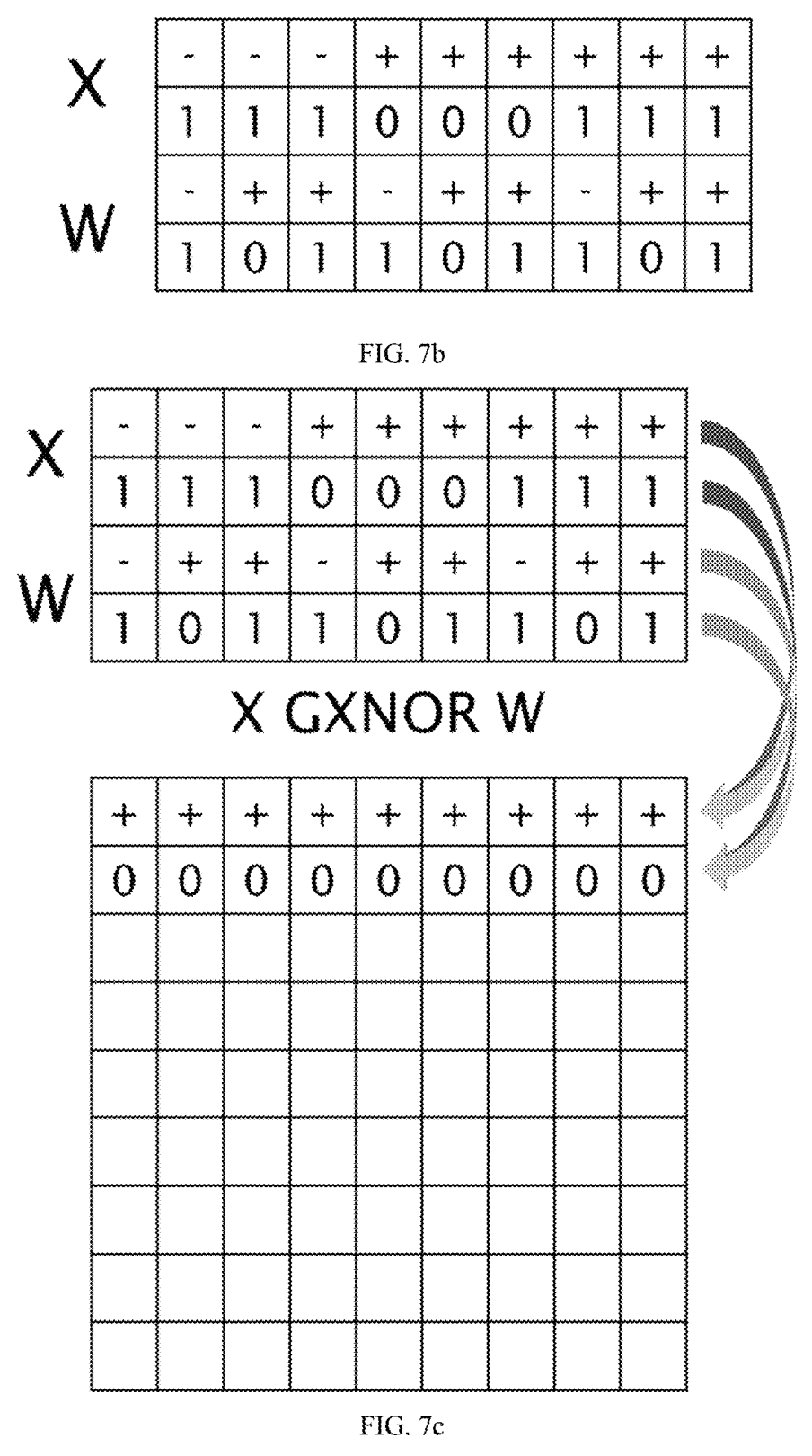

FIG. 7a to FIG. 7e show schematic diagrams of GXNOR operation process of a valuing vector in a memory array. As shown in FIG. 7a, before starting writing, a reset pulse current is required to initialize the memory array to the first resistance state. At this time, a value stored by the sign bit represents "+", and a value stored by the numerical bit is "0". An X memory cell and a W memory cell are split into the numerical bit and the sign bit to be written into the memory cell, and a result thereof is shown in FIG. 7b. As shown in FIG. 7c, when calculating X and W strings, data of the X memory cell and the W memory cell is read using PCSA and stored in an operation array of the initial state. A calculation result may be determined by an X/W readout pulse, a process of which has been described in detail in the relevant embodiments in FIG. 5, and may also be extended to an implementation of the memory array, which will not be repeated here. As shown in FIG. 7d, a final calculation result is stored in the operation array, and reflected by a resistance value of a ternary synapse, and a result thereof is also consistent with a truth table (as shown in FIG. 7e) of GXNOR. In the above-mentioned embodiments, all ternary synapses are composed of the same three-state spintronic device structure, which may facilitate a large-scale integration while achieving a nanosecond resistance state switching and operation.

So far, embodiments of the present disclosure have been described in detail in combination with the accompanying drawings. It should be noted that implementation methods not shown or described in the accompanying drawings or the text of the specification are all forms known to those skilled in the technical art and have not been described in detail. In addition, the above-mentioned definitions of various components and methods are not limited to various specific structures, shapes, or methods mentioned in embodiments, and may be simply modified or replaced by those skilled in the technical art.

Based on the above-mentioned descriptions, those skilled in the art should have a clear understanding of the three-state spintronic device, the memory cell, the memory array and the read-write circuit of the present disclosure.

It can be seen from the above-mentioned technical solutions that the three-state spintronic device, the memory cell, the memory array and the read-write circuit of the present disclosure have at least one or part of the following advantages:

(1) The three-state spintronic device provided by the present disclosure may effectively drive a domain wall to move and displace by a spin-orbit torque without an external field assistance under a full electric field condition. A magnitude and a direction of the displacement may be modulated by the number of pulses, a pulse width and the direction of current, which may have a high reliability and a circuit compatibility.

(2) The memory cell provided by the present disclosure may achieve a multi-valued memory within a single memory cell, which may reduce a storage area required to store an information of a same byte.

(3) The three-state spintronic device provided by the present disclosure may be used as a logical operation device to achieve a GXNOR logical operation of data X and a weight W in a ternary neural network, which is not stored in an array in a volatile manner.

In summary, the present disclosure provides a three-state spintronic device that simultaneously has a full electric field control and a high reliability, a memory cell, a memory array, and a read-write circuit, which may achieve a process of a directional movement of the magnetic domain wall without an external field assistance, so that a scaling and an integration of the device may be improved. At the same time, a neural network application may be achieved through a design of read, write, and logical operation circuits.

It should also be noted that directional terms mentioned in embodiments, such as "up", "down", "front", "back", "left", "right", etc., only directions referring to the accompanying drawings and are not intended to limit the scope of protection of the present disclosure. Throughout the accompanying drawings, the same elements are indicated by the same or similar reference numerals. When it may cause confusion in the understanding of the present disclosure, conventional structures or configurations may be omitted.

A shape and a size of each component in the drawings do not reflect the actual size and ratio, but only represent contents of embodiments of the present disclosure. In addition, in the claims, any reference symbols between parentheses should not be constructed as a restriction on the claims.

Furthermore, a word "containing", "including" or "comprising" does not exclude the presence of elements or steps not listed in the claims. A word "a" or "an" preceding an element does not exclude the presence of a plurality of the elements. Ordinal numbers such as "first", "second", "third", etc. used in the specification and claims are only to modify corresponding elements, which does not mean any ordinal numbers of the elements, or an order of an element and another element, or any order in a manufacturing method. The ordinal numbers are used only to clearly distinguish an element having a name from another element having the same name. Similarly, it should be understood that, in order to simply the present disclosure and help understand one or more of disclosed aspects of the present disclosure, in the above-mentioned descriptions of exemplary embodiments of the present disclosure, various features of the present disclosure are sometimes grouped together into a single embodiment, drawing, or descriptions thereof. However, the method of the present disclosure should not be construed as reflecting an intention that: the present disclosure to be claimed is required to describe more features than those explicitly recited in each claim. More specifically, as reflected in the following claims, the disclosed aspect needs to have fewer features than all features of the previously disclosed single embodiment. Therefore, the claims, which follow a specific implementation method, are explicitly incorporated into the specific implementation method, in which each claim itself serves as a separate embodiment of the present disclosure.

The above-mentioned specific embodiments have described in detail the objectives, technical solutions and advantages of the present disclosure. It should be noted that the above are only specific embodiments of the present disclosure and are not intended to limit the present disclosure. Any modifications, equivalent substitutions, improvements, and the like made within the spirit and scope of the present disclosure shall be included in the scope of protection of the present disclosure.

What is claimed is:

1. A three-state spintronic device, comprising: a bottom electrode, a magnetic tunnel junction and a top electrode from bottom to top;
   wherein the magnetic tunnel junction comprises: a spin-orbit coupling layer, a ferromagnetic free layer, a barrier tunneling layer and a ferromagnetic reference layer from bottom to top; and the magnetic tunnel junction further comprises:
   three local magnetic domain wall pinning centers embedded in the spin-orbit coupling layer, wherein the three local magnetic domain wall pinning centers are respectively in contact with the ferromagnetic free layer, and a first pinning region, a second pinning region and a third pinning region are formed in the ferromagnetic free layer; and
   magnetic domain wall nucleation centers at two ends of the ferromagnetic free layer, wherein the magnetic domain wall nucleation centers have an anisotropy constant of $7 \times 10^5$ J/m$^3$ to $9 \times 10^5$ J/m$^3$; and a first nucleation region and a second nucleation region are formed in the ferromagnetic free layer; and
   wherein a current pulse is injected into the spin-orbit coupling layer, and a spin current is generated to drive a magnetic domain wall in the ferromagnetic free layer to move, so that a resistance state switching is performed.

2. The three-state spintronic device according to claim 1, wherein materials of the ferromagnetic free layer and the ferromagnetic reference layer are any one of CoFeB, CoFeAl and Co; a material of the spin-orbit coupling layer is W and/or Ta; and materials of the local magnetic domain wall pinning centers and the magnetic domain wall nucleation centers are Pt and/or Ir.

3. The three-state spintronic device according to claim 1, wherein a moving direction of the magnetic domain wall is consistent with a direction of the injection of the current pulse.

4. The three-state spintronic device according to claim 1, wherein the bottom electrode comprises:
   a first electrode connected to a first end of the spin-orbit coupling layer; and
   a second electrode connected to a second end of the spin-orbit coupling layer;
   wherein the first end of the spin-orbit coupling layer is arranged opposite to the second end of the spin-orbit coupling layer.

5. A memory cell, comprising:
   the three-state spintronic device according to claim 1;
   a first transistor, wherein a first end of the first transistor is connected to a first end of the bottom electrode, a second end of the first transistor is configured to be connected to a write bit line, and a control end of the first transistor is configured to be connected to a write word line: a second end of the bottom electrode is configured to be connected to a source line; and
   a second transistor, wherein a first end of the second transistor is connected to the top electrode, a second end of the second transistor is configured to be connected to a read bit line, and a control end of the second transistor is configured to be connected to a read word line.

6. A read-write circuit, comprising:
   the memory cell according to claim 5;
   a first reference cell configured to obtain a first reference voltage according to an enable signal;
   a first sense amplifier, wherein a first input end of the first sense amplifier is connected to a read bit line connected to the memory cell, a second input end of the first sense amplifier is configured to receive the first reference voltage, and output ends of the first sense amplifier output a first output signal and a first complementary signal, respectively:
   a second reference cell configured to obtain a second reference voltage according to the first complementary signal;
   a third reference cell configured to obtain a third reference voltage according to the first output signal; and
   a second sense amplifier, wherein a first input end of the second sense amplifier is connected to the read bit line connected to the memory cell, a second input end of the second sense amplifier is configured to receive the second reference voltage and the third reference voltage, and output ends of the second sense amplifier output a second output signal and a second complementary signal, respectively.

7. The read-write circuit according to claim 6, wherein the first reference cell comprises;
   a third transistor, wherein a first end of the third transistor is grounded, and a control end of the third transistor receives the enable signal; and a first reference resistance, wherein an end of the first reference resistance is connected to a second end of the third transistor, and another end of the first reference resistance is connected to the second input end of the first sense amplifier;

wherein the second reference cell comprises:
a fourth transistor, wherein a first end of the fourth transistor is grounded, and a control end of the fourth transistor receives the first complementary signal; and
a second reference resistance, wherein an end of the second reference resistance is connected to a second end of the fourth transistor, and another end of the second reference resistance is connected to the second input end of the second sense amplifier; and wherein the third reference cell comprises:
a fifth transistor, wherein a first end of the fifth transistor is grounded, and a control end of the fifth transistor receives the first output signal; and
a third reference resistance, wherein an end of the third reference resistance is connected to a second end of the fifth transistor, and another end of the third reference resistance is connected to the second input end of the second sense amplifier.

8. A memory array, comprising: m read word lines, m write word lines, n write bit lines, n read bit lines, n source lines, and m rows and n columns of memory cells, wherein the memory cell is the memory cell according to claim 5, and each of m and n is a positive integer;
each of the memory cells in a same column is connected to a same write bit line, each of the memory cells in the same column is connected to a same read bit line, and each of the memory cells in the same column is connected to a same source line; and
each of the memory cells in a same row is connected to a same write word line, and each of the memory cells in the same row is connected to a same read word line.

9. A read-write circuit, comprising:
the memory array according to claim 8;
a bit line decoder configured to provide a bit line operating voltage to n write bit lines and n read bit lines;
a word line decoder configured to provide a word line operating voltage to m read word lines and m write word lines;
a source line decoder configured to provide a source line operating voltage and an induced current to n source lines; and
a read operation module configured to read data stored in the memory array and perform a logical operation on the data stored in the memory array.

10. The read-write circuit according to claim 9, wherein the read operation module comprises:
a first reference cell configured to provide a first reference voltage when performing a read operation on the memory array or performing a logical operation or an operation on the memory array, wherein the first reference cell comprises:
a third transistor, wherein a first end of the third transistor is grounded, and a control end of the third transistor receives the enable signal; and
a first reference resistance, wherein an end of the first reference resistance is connected to a second end of the third transistor, and another end of the first reference resistance is connected to a second input end of a first sense amplifier:
the first sense amplifier, wherein a first input end of the first sense amplifier is connected to n read bit lines connected to the memory cell, the second input end of the first sense amplifier is configured to receive the first reference voltage, and output ends of the first sense amplifier output a first output signal and a first complementary signal, respectively;
a second reference cell configured to obtain a second reference voltage according to the first complementary signal when performing a logical operation or an operation on the memory array, wherein the second reference cell comprises:
a fourth transistor, wherein a first end of the fourth transistor is grounded, and a control end of the fourth transistor receives the first complementary signal; and
a second reference resistance, wherein an end of the second reference resistance is connected to a second end of the fourth transistor, and another end of the second reference resistance is connected to a second input end of a second sense amplifier;
a third reference cell configured to obtain a third reference voltage according to the first output signal when performing a logical operation or an operation on the memory array, wherein the third reference cell comprises:
a fifth transistor, wherein a first end of the fifth transistor is grounded, and a control end of the fifth transistor receives the first output signal; and
a third reference resistance, wherein an end of the third reference resistance is connected to a second end of the fifth transistor, and another end of the third reference resistance is connected to the second input end of the second sense amplifier; and
the second sense amplifier, wherein a first input end of the second sense amplifier is connected to the read bit line connected to the memory cell, the second input end of the second sense amplifier is configured to receive the second reference voltage and the third reference voltage, and output ends of the second sense amplifier output a second output signal and a second complementary signal, respectively.

* * * * *